United States Patent
Bowman et al.

(10) Patent No.: US 10,183,465 B1
(45) Date of Patent: Jan. 22, 2019

(54) FABRIC PRODUCT HAVING FLAME RESISTANT PROPERTIES

(71) Applicant: Samtech, LLC, Los Angeles, CA (US)

(72) Inventors: Jeffery B. Bowman, Ashland, OR (US); Wesley W. Burgess, Ashland, OR (US); Malcolm Hensley, El Segundo, CA (US)

(73) Assignee: Samtech, LLC, Los Angeles, CA (US)

( * ) Notice: Subject to any disclaimer, the term of this patent is extended or adjusted under 35 U.S.C. 154(b) by 155 days.

(21) Appl. No.: 15/000,757

(22) Filed: Jan. 19, 2016

Related U.S. Application Data (63) Continuation of application No. 13/302,462, filed on Nov. 22, 2011, now abandoned.

(60) Provisional application No. 61/416,122, filed on Nov. 22, 2010.

(51) Int. Cl.
| | | |
|---|---|---|
| *B32B 5/26* | (2006.01) |
| *A41D 31/00* | (2006.01) |
| *A62B 17/00* | (2006.01) |
| *B32B 27/32* | (2006.01) |
| *B32B 27/36* | (2006.01) |
| *B32B 27/34* | (2006.01) |

(52) U.S. Cl.
CPC ............ *B32B 5/26* (2013.01); *A41D 31/0022* (2013.01); *A41D 31/0027* (2013.01); *A62B 17/00* (2013.01); *B32B 27/32* (2013.01); *B32B 27/34* (2013.01); *B32B 27/36* (2013.01); *B32B 2262/0253* (2013.01); *B32B 2262/0261* (2013.01); *B32B 2262/0276* (2013.01); *B32B 2307/3065* (2013.01); *B32B 2437/00* (2013.01); *B32B 2571/02* (2013.01)

(58) Field of Classification Search
CPC ............ A41D 31/0022; A41D 31/0027; A62B 17/003; B32B 5/026; B32B 5/22; B32B 5/26; B32B 27/12; B32B 2307/3065; D06M 13/08; D06M 13/282–13/313; D06M 15/667–15/673; D06M 15/244; D06M 2200/30
USPC ................ 428/920, 921; 442/136, 141–146, 442/286–294, 306, 318
See application file for complete search history.

(56) References Cited

U.S. PATENT DOCUMENTS

| | | |
|---|---|---|
| 2,784,159 A | 3/1957 | Fluck |
| 3,650,820 A | 3/1972 | DiPietro et al. |
| 3,660,582 A | 5/1972 | DiPietro |
| 3,841,902 A * | 10/1974 | Thompson ........ D06M 15/3564 428/375 |
| 3,945,987 A | 3/1976 | Stossel |
| 4,076,540 A | 2/1978 | Stossel |
| 4,855,360 A | 8/1989 | Duchesne et al. |
| 4,863,983 A | 9/1989 | Johnson et al. |
| 4,868,041 A | 9/1989 | Yamagishi et al. |
| 5,025,052 A | 6/1991 | Crater et al. |

(Continued)

OTHER PUBLICATIONS

TPP Test Device, 3 pages, dated Nov. 17, 2010, Measurement Technology Northwest,http://www.mtnw-usa.com/thermalsystems/products/flame-test/thermal-protective-performance.

*Primary Examiner* — Jenna L Johnson
(74) *Attorney, Agent, or Firm* — Dority & Manning, P.A.

(57) ABSTRACT

Thermal protective fabrics and garments are disclosed made from fabrics treated with a fire retardant composition. In one embodiment, the fabrics include a multi-layered construction or a multi-face construction that are treated with the fire retardant composition.

21 Claims, 4 Drawing Sheets

(56) References Cited

U.S. PATENT DOCUMENTS

| | | | |
|---|---|---|---|
| 5,145,727 A | 9/1992 | Potts et al. | |
| 5,178,931 A | 1/1993 | Perkins et al. | |
| 5,356,700 A | 10/1994 | Tanaka et al. | |
| 5,459,188 A | 10/1995 | Sargent et al. | |
| 5,517,691 A | 5/1996 | Blake | |
| 5,727,401 A * | 3/1998 | Statham | A41D 31/0022 2/458 |
| 5,798,402 A | 8/1998 | Fitzgerald et al. | |
| 6,541,068 B1 | 4/2003 | Galbraikh et al. | |
| 6,637,085 B2 | 10/2003 | Chi et al. | |
| 6,666,235 B2 | 12/2003 | Chi et al. | |
| 6,699,802 B1 | 3/2004 | Hainsworth et al. | |
| 7,182,991 B1 | 2/2007 | Hirschmann, Jr. et al. | |
| 7,344,758 B2 | 3/2008 | Franchina et al. | |
| 7,348,059 B2 | 3/2008 | Zhu | |
| 7,676,855 B2 | 3/2010 | Dunn | |
| 7,776,421 B2 * | 8/2010 | Rock | A41D 31/0027 428/88 |
| 8,012,890 B1 * | 9/2011 | Li | B32B 5/022 428/913 |
| 8,557,347 B1 | 10/2013 | Hensley | |
| 2004/0116022 A1 * | 6/2004 | Langley | A41D 31/02 442/289 |
| 2005/0272838 A1 | 12/2005 | Yang | |
| 2006/0166578 A1 | 7/2006 | Myers et al. | |
| 2006/0189240 A1 | 8/2006 | Taylor et al. | |
| 2006/0202175 A1 | 9/2006 | Yang | |
| 2006/0213913 A1 | 9/2006 | Von Blucher | |
| 2006/0292953 A1 | 12/2006 | Ashley et al. | |
| 2007/0020455 A1 | 1/2007 | Myers et al. | |
| 2007/0021023 A1 | 1/2007 | Altman et al. | |
| 2007/0022587 A1 | 2/2007 | Myers et al. | |
| 2007/0186353 A1 | 8/2007 | Fang | |
| 2007/0249250 A1 | 10/2007 | Servajean | |
| 2008/0242175 A1 * | 10/2008 | Narayanan | A41D 31/0027 442/136 |
| 2009/0019624 A1 | 1/2009 | Birk et al. | |
| 2009/0056029 A1 | 3/2009 | Hall, III et al. | |
| 2009/0061717 A1 | 3/2009 | Hall, III et al. | |
| 2009/0110919 A1 | 4/2009 | Panse | |
| 2009/0246485 A1 | 10/2009 | Panse et al. | |
| 2010/0326582 A1 | 12/2010 | Panse | |
| 2010/0330275 A1 | 12/2010 | Panse | |
| 2011/0000599 A1 | 1/2011 | Panse | |
| 2011/0076494 A1 * | 3/2011 | Gunzel | A41D 31/0027 428/355 R |

* cited by examiner

FABRIC PRODUCT HAVING FLAME RESISTANT PROPERTIES

RELATED APPLICATIONS

The present application is a continuation application of U.S. patent application Ser. No. 13/302,460, filed on Nov. 22, 2011, which claims priority to U.S. Provisional Patent Application Ser. No. 61/416,122, filed on Nov. 22, 2010, which are all incorporated herein by reference.

BACKGROUND

Flame resistant fabrics are used in numerous applications. In many environments, for instance, garments and apparel with flame resistant properties are highly desirable in order to protect the wearer. For example, military personnel operating in war zones can be exposed to various incendiary devices. Wearing fire resistant garments in such environments can minimize harm to the wearer and ultimately can prevent the loss of life.

In fact, the United States Military Services are currently providing those in combat zones with flame resistant garments to protect against burn injuries. Such garments should have excellent flame resistant properties. For instance, the garments should perform well when tested according to ASTM Test F1930, which is referred to as the Thermal Mannequin Test. During the Thermal Mannequin Test, the garment is placed on a mannequin and exposed to a massive flame event. Specialized sensors are placed on the mannequin to monitor and predict burn injury. ASTM F1930 testing conducted using exposure to a simulated 4 second flash fire predicts that FR garments currently used by the US Army will help protect the wearer from suffering second and third degree burn injuries underneath these FR garments. The current FR Army Combat Uniform, for example, is predicted by ASTM F 1930 to limit the amount of body area suffering from second and third degree burns under the uniform to less than 35% when exposed to a simulated 4 second flash fire.

Electrical workers, firefighters, police personnel, oil rig workers and many other occupations face similar burn threats on a regular basis while operating outside, often in inclement conditions while carrying heavy loads. Unfortunately, because of the limitations of existing flame resistant fabrics, these workers, like the military personnel, must often compromise weight, durability and environmental protection when they don traditional flame resistant clothing.

In the past, many fire resistant garments and other clothing articles were made from fabrics containing primarily or exclusively aramid fibers. Aramid fibers, such as para-aramid fibers and meta-aramid fibers, for instance, have inherent flame resistant properties. Producing a fabric exclusively from aramid fibers, however, can have various disadvantages. For instance, such fabrics are not only relatively expensive to produce, but aramid fibers have historically not always been readily available. In addition, these fabrics are difficult to dye and are not amenable to many printing processes. Furthermore, due to the limitations in aramid fiber size availability and the inability to make a complete array of yarn sizes, the fabrics may not have a desired combination of properties such as strength, weight, breathability, drape, hand, durability and the like.

In order to improve one or more properties of fabrics containing aramid fibers, those skilled in the art have proposed blending the aramid fibers with other flame resistant fibers, such as FR cotton.

One problem that has continued in the design and construction of flame resistant fabrics is the inability to produce fabrics containing substantial amounts of synthetic fibers, particularly polyester fibers, polyolefin fibers, and/or nylon fibers, that possess desirable flame resistant properties. The above synthetic fibers, typically found in the highest performing non-flame resistant apparel designed for rugged outdoor use, are desirable because they enable the construction of superior performing fabrics with respect to weight, durability, hand, drape and environmental protection. Unfortunately, the above synthetic fibers have a tendency to burn, drip and melt when exposed to an open flame. Thus, polyester fibers and nylon fibers have been used in relatively minor amounts in flame resistant fabrics, such as by being present in amounts no more than about 20% by weight. Thus, a need exists for a fabric construction and a fabric treatment that are capable of producing a fabric product containing substantial amounts of non-inherently flame resistant synthetic fibers, while still possessing the desired flame resistant properties and protection from burn injuries. There is also a need for systems and methods for producing the fabric products.

SUMMARY

In general, the present disclosure is directed to various thermal protective fabrics and to garments made from the fabrics treated with a fire retardant composition. In one particular embodiment, the present disclosure is directed to engineered fabrics having a multi-layered construction or a multi-face construction that are treated with the fire retardant composition.

In one embodiment, the present disclosure is particularly directed to enhancing the flame resistant properties of fabric substrates containing substantial amounts of non-inherently flame resistant, synthetic fibers. As used herein, non-inherently flame resistant synthetic fibers are fibers made from materials that have a tendency to burn, melt and/or drip when subjected to an open flame. Such materials include particularly nylon fibers which are non-aromatic polyamide fibers, polyester fibers, and polyolefin fibers, such as polypropylene fibers.

In one embodiment, the present disclosure is directed to producing fabric products having excellent flame resistant properties wherein at least one surface of the fabric product is made primarily from non-inherently flame resistant, synthetic fibers (e.g., polyester fibers, polyolefin fibers or non-aromatic polyamide fibers) that have been treated with a flame retardant composition, as will be described in greater detail below.

Fabrics made according to the present disclosure can also contain inherently flame resistant fibers. Such fibers include aramid fibers, such as para-aramid fibers and meta-aramid fibers, which are both aromatic polyamide fibers. Other inherently flame resistant fibers include polybenzimidazole ("PBI") fibers.

In one embodiment, the present disclosure is directed to a fabric product having flame resistant properties. The fabric product comprises a fabric substrate. The fabric substrate may comprise a multi-layer fabric or a fabric laminate which may include different fabric layers optionally combined with film layers. The fabric substrate can comprise a woven fabric, a knitted fabric, a non-woven fabric, or combinations of these.

In one particular embodiment of the present disclosure, the fabric substrate includes a first outer layer and a second outer layer. As used herein, a multiple layered fabric may comprise a fabric having two distinct plies, such as a fabric laminate or may comprise a fabric having distinct or separate surfaces, such as a spacer fabric.

The fabric substrate of the present disclosure may include a first outer layer that comprises non-inherently flame resistant synthetic fibers in an amount of at least about 30% by weight, such as in an amount of at least about 40% by weight, based on the weight of the first outer layer. The non-inherently flame resistant fibers, for instance, may comprise greater than about 50%, such as greater than about 60%, such as greater than about 70%, such as even greater than about 80% of the first outer layer. The non-inherently flame resistant synthetic fibers, as described above, may comprise polyamide fibers, polyester fibers, polyolefin fibers, or mixtures thereof.

In accordance with the present disclosure, the fabric substrate is treated with a flame retardant composition. In one embodiment, the flame retardant composition may be impregnated into one or more layers of the fabric substrate. Alternatively, the flame retardant composition may be coated on the fabric substrate or may comprise a combination of coating and impregnation. The particular flame retardant composition used in the present disclosure can vary depending upon the particular application and the desired result. In one embodiment, the flame retardant composition contains at least one flame retardant, such as a halogen-containing compound and/or a phosphorus-containing compound.

As described above, various different types of fabric substrates may be treated in accordance with the present disclosure. In one embodiment, for instance, the fabric substrate comprises a laminate in which a film layer is positioned in between a first outer fabric layer and a second outer fabric layer. The film layer may be elastic and may be made from various materials, such as a polyester polymer, a polyurethane polymer, a polytetrafluoroethylene polymer, or mixtures of these. Generally, at least the first outer layer of the laminate comprises a fabric, such as a knitted fabric, that contains primarily non-inherently flame resistant synthetic fibers. In one embodiment, for instance, the first outer layer comprises polyester fibers, polyolefin fibers or nylon fibers (or a combination of these) alone or in combination with elastomeric fibers, such as fibers made from a polyurethane-polyurea copolymer, which are referred to as SPANDEX fibers. The elastic fibers may be present in the first outer layer in an amount from 0% to about 15% by weight. The second outer layer of the fabric laminate may comprise a similar or dissimilar fabric in comparison to the first outer layer. In one embodiment, the second outer layer comprises a knitted fabric containing inherently flame resistant fibers, such as meta-aramid fibers.

The fabric substrate can comprise a spacer fabric, in some embodiments. The spacer fabric may include a first yarn, a second yarn, and a third yarn. The spacer fabric can include a first outer layer comprised primarily of the first yarn and a second outer layer comprised primarily of the second yarn. The third yarn may connect the first outer layer to the second outer layer. In accordance with the present disclosure, at least the first outer layer of the spacer fabric may be comprised primarily of non-inherently flame resistant synthetic fibers, such as nylon fibers, polyolefin fibers, polyester fibers, or mixtures thereof.

In one set of embodiments, the fabric substrate may comprise a plated fabric. As used herein, a plated fabric refers to a fabric that is produced from two yarns of different characters, qualities, and/or fibers in which one yarn appears on one face or side of the fabric and the other yarn appears on the opposite face or side of the fabric. Thus, a plated fabric is a single ply fabric that has different characteristics on each side of the ply. In accordance with the present disclosure, the plated fabric may have a first surface that is comprised primarily of a first yarn and may have a second and opposite surface that may be comprised primarily of a second yarn. In accordance with the present disclosure, the first yarn that comprises primarily the first surface of the fabric is primarily comprised of non-inherently flame resistant synthetic fibers, such as polyester fibers, polyolefin fibers, nonaromatic polyamide fibers, or mixtures thereof. The plated fabric may comprise a woven fabric or a knitted fabric. Plated fabrics that may be used in accordance with the present disclosure include plated circular knit fabrics and plated warp knit fabrics. ASTM F2703 is a standard test method for evaluation of flame resistant fabrics intended for clothing designed to reduce burn injuries. Although not directly predictive of burn injury as measured by ASTM F1930, it has the advantage of not being susceptible to variations in garment construction, fit and features as is the case with ASTM F1930. ASTM F 2703 demonstrates that fabric substrates treated in accordance with the present disclosure perform equivalent to fabrics made from inherently flame resistant or traditionally treated fibers or fabrics.

It was surprisingly discovered that fabric substrates made almost entirely of non-inherently flame resistant synthetic fibers can be treated with a flame resistant composition and display excellent flame resistant properties. For instance, fabric substrates treated in accordance with the present disclosure when tested according to ASTM Test Method D-6413-08, which is referred to as a flame test, may have a char length of less than 5 inches, such as less than two inches. The fabric substrate may also have an after flame of less than about 10 seconds, such as less than about five seconds, such as less than about two seconds, such as even less than about one second. In addition, the fabric substrate may have an afterglow of less than about 10 seconds, such as less than about five seconds, such as less than about two seconds, such as even less than about one second. Furthermore, when the fabric substrates are formed into garments, the garments may protect against burn injuries when tested according to ASTM Test Method F1930 equivalent to fabrics made from inherently flame resistant or traditionally treated fibers or fabrics. For instance, garments made according to the present disclosure, when tested according to ASTM Test Method F1930, may have less than about 50% predicted body burn, such as less than about 40% predicted body burn, such as less than about 30% predicted body burn, such as even less than about 20% predicted body burn when exposed to a flash fire exposure of four seconds.

Fabric substrates and garments made according to the present disclosure also perform well under ASTM Test Method F2703, which is also referred to as the Thermal Protective Performance Test. ASTM F2703 is a standard test method for evaluation of flame resistant fabrics intended for clothing designed to reduce burn injuries. Although not directly predictive of burn injury as measured by ASTM F1930, it has the advantage of not being susceptible to variations in garment construction, fit and features as is the case with ASTM F1930.

The ASTM F2703 Test measures the time elapsed for convective and radiant heat to penetrate through a fabric or a composite fabric. More particularly, during the test, the fabric substrate is exposed to two propane burners and a quartz infrared heat lamp assembly. The average temperature rise as heat penetrates through the fabric substrate is recorded. The results are compared to Stoll's curve, which represents the blister point of human skin as a function of heat and time. The point of intersection between the two curves provides the fabric's rating. ASTM F 2703 demonstrates that fabric substrates treated in accordance with the present disclosure perform equivalent to fabrics made from inherently flame resistant or traditionally treated fibers or fabrics.

In one embodiment, fabric substrates made according to the present disclosure when tested according to ASTM Test Method F2703 have a rating of less than 50 cal/cm$^2$, such as less than about 40 cal/cm$^2$, such as less than about 30 cal/cm$^2$, such as even less than about 20 cal/cm$^2$.

Once treated with the flame retardant composition, the fabric substrate can also be treated with later coatings or other treatments, such as finishes. In one embodiment, for instance, a durable water resistant coating may be applied to the fabric in conjunction with the flame retardant composition.

In some embodiments, the fabric substrate can be dyed and/or printed. For instance, in one particular embodiment, the fabric substrate can first be dyed and then printed with a pattern, such as a camouflage pattern.

Other features and aspects of the present disclosure are discussed in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Repeat use of reference characters in the present specification and drawings is intended to represent the same or analogous features or elements of the present invention.

DETAILED DESCRIPTION

It is to be understood by one of ordinary skill in the art that the present discussion is a description of exemplary embodiments only, and is not intended as limiting the broader aspects of the present disclosure.

In general, the present disclosure is directed to thermal protective fabrics that have enhanced flame resistant properties and garments made from the fabrics. In one embodiment, the present disclosure is directed to a particular fabric construction that either includes different fabric layers or comprises a fabric substrate that has opposing surfaces or faces with different characteristics. In accordance with the present disclosure, at least one side of the fabric substrate or layer of the fabric substrate contains substantial amounts, such as greater than about 30% by weight, of non-inherently flame resistant synthetic fibers, such as polyester fibers, nylon fibers, or polyolefin fibers. Once these fabrics are treated with a flame retardant composition, it was discovered that the fabric construction allows for the use of substantial amounts of non-inherently flame resistant synthetic fibers that can provide the fabric substrate with excellent properties such as durability, hand, drape, weight and environmental protection, while still having excellent flame resistant properties capable of protecting a wearer when exposed to an open flame, such as a flash fire. In particular, the present inventors discovered that fabric substrates containing significant amounts of non-inherently flame resistant synthetic fibers made in accordance with the present disclosure can still display excellent flame resistant properties such as when tested according to ASTM Test Method D6413-08 and burn protective properties such as when tested according to ASTM Test Method F1930 and ASTM Test Method F2703.

Because fabric products made in accordance to the present disclosure have excellent flame resistant properties, the fabrics are especially well suited for constructing apparel and other similar articles designed to protect against the threat of a flash fire, an electric arc, or the like. In addition to having flame resistant properties, the fabrics can also be designed to have stretch, breathability, water resistance, and the like.

In producing fabric products according to the present disclosure, the fabric substrate can be treated with a flame retardant composition. For instance, the flame retardant composition can be used to treat the entire fabric substrate, one layer in the fabric substrate, or yarns that are used to produce the fabric substrate.

As described above, fabric substrates treated in accordance to the present disclosure may comprise any suitable type of fabric material. For instance, woven fabrics, knitted fabrics, non-woven fabrics, or combinations of these may be used. Knitted fabrics that may be constructed in accordance with the present disclosure include warp knitted fabrics and weft knitted fabrics. The knitted fabrics may have a single face or may have a double face construction. The type of knitted fabrics that may be made in accordance with the present disclosure include tricot knits, Milanese knits, Raschel knits, circular knits, flat knits, and the like. The fabric substrate can contain substantial amounts of non-inherently flame resistant synthetic fibers and still have excellent flame resistant properties once treated with the flame retardant composition. In one embodiment, for instance, the fabric substrate may contain one or more non-inherently flame resistant synthetic fibers in the amount of at least 30% by weight, such as in an amount of at least 40% by weight, such as in an amount of at least about 50% by weight, such as an amount of at least 60% by weight, such as an amount of at least 70% by weight, such as an amount of at least 80% by weight. Such fibers include particularly polyester fibers, polyolefin fibers, and nylon fibers. Of particular advantage, the non-inherently flame resistant synthetic fibers may be present on at least one surface of the fabric substrate in amounts that improve various properties of the product, such as strength, breathability, drape, hand, durability, and the like.

Figure 1:
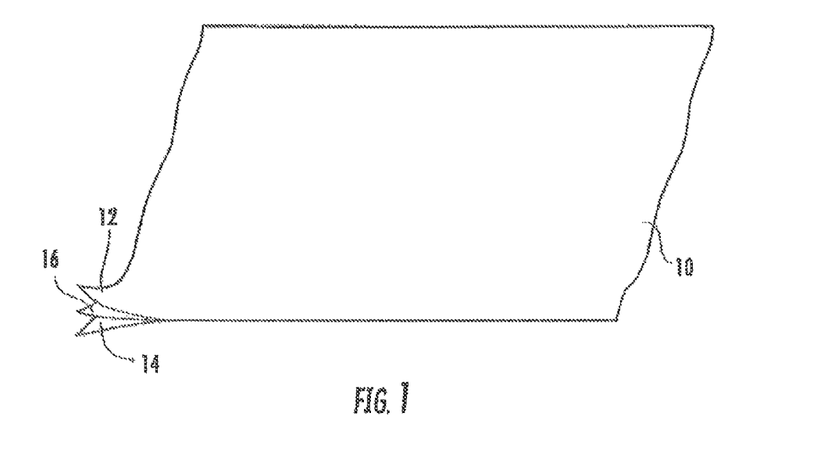
FIG. 1 is a perspective view of one embodiment of a fabric substrate made in accordance with the present disclosure.
Figure 2:
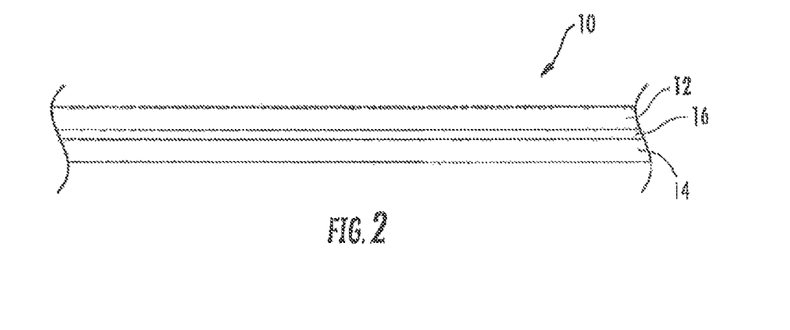
FIG. 2 is a cross-sectional view of the fabric substrate illustrated in FIG. 1.

In one embodiment, the fabric substrate treated in accordance with the present disclosure contains multiple layers. For instance, FIGS. 1 and 2 illustrate an exemplary fabric laminate generally 10 that may be treated in accordance with the present disclosure. As shown particularly in FIG. 2, in this embodiment, the fabric laminate 10 includes three layers. The three layers include a first outer fabric layer 12, a second outer fabric layer 14, and a film layer 16 positioned in between the outer fabric layers. The film layer 16 can be incorporated into the fabric laminate 10 in order to provide the laminate with air and/or water impervious properties. The film layer 16, in one embodiment, may comprise an elastic film, such as a polyurethane film, a polyester film, or a polytetrafluoroethylene film.

The outer fabric layers 12 and 14 may comprise woven fabrics, knitted fabrics, or non-woven fabrics. The first outer layer fabric 12 may be the same or may be different than the second outer layer fabric 14.

In one embodiment, one or both fabric layers 12 and 14 contain a relatively high percentage of polyester fibers, nylon fibers, polypropylene fibers, or mixtures thereof. For instance, each fabric layer may comprise up to 100% polyester fibers, or up to 100% nylon fibers. In another embodiment, one of both fiber layers may contain a blend of cotton fibers with either polyester fibers or nylon fibers. For instance, each fabric layer may contain 0% to 60% by weight cotton fibers combined with from about 40% to about 100% by weight nylon fibers, polyolefin fibers, or polyester fibers. In yet another embodiment, the fabric may contain in addition to or instead of cotton fibers polyacrylonitrile (PAN) fibers.

In one embodiment, the first outer layer fabric 12 may comprise at least 40% by weight nylon fibers, polypropylene fibers, or polyester fibers, while the second outer layer fabric 14 may comprise inherently flame resistant fibers alone or in combination with other fibers. For instance, the second outer layer 14 may contain meta-aramid fibers alone or in combination with other fibers, such as wool fibers, FR cotton fibers, and the like.

In one embodiment, in order to provide the fabric laminate 10 with stretch properties, one or both outer fabric layers 12 and 14 may contain elastic fibers. The elastic fibers may comprise, for instance, polyurethane fibers, such as fibers made from a polyurethane polyurea copolymer. Such fibers include, for instance, SPANDEX filaments, and/or LYCRA® filaments. The elastic fibers can be incorporated into each fabric layer in an amount from about 1% to about 30% by weight, such as in an amount from about 1% to about 15% by weight, such as in an amount from about 1% to about 5% by weight. The elastic fibers can provide the fabric laminate with stretch and recovery properties that can improve comfort and fit when the fabric laminate is formed into a garment.

When the outer fabric layers 12 and 14 comprise woven or knitted fabrics, the above described combination of fibers can be formed into yarns that are used to produce the fabrics. The yarns used to produce the fabric can contain only a single fiber type or may contain blended fibers. In one embodiment, when incorporating elastic fibers into the fabric layers, the elastic fibers may comprise filaments that are wrapped around yarns containing the other fibers. When forming knitted fabrics, the above yarns can be used as the ends. When forming woven fabrics, on the other hand, the above yarns can be used as the warp yarns, the weft yarns, or both.

When forming the fabric laminate 10 as shown in FIGS. 1 and 2, the different layers can be combined and attached together using any suitable method. In one particular embodiment, for instance, a flame resistant adhesive may be used to attach the film layer 16 to each of the outer fabric layers 12 and 14.

In addition to fabric laminates, various other multilayered fabrics may be treated in accordance with the present disclosure. In one embodiment, for instance, the fabric substrate may comprise a single fabric that has a plated knit or woven construction. In a plated knit construction, for instance, one type of yarn may appear on one face of the fabric while another type of yarn may appear on the opposite and second face of the fabric. In this manner, different fiber materials and types can be used to primarily form one face of the fabric while other fiber types may be used to produce the opposite face of the fabric.

Figure 3:
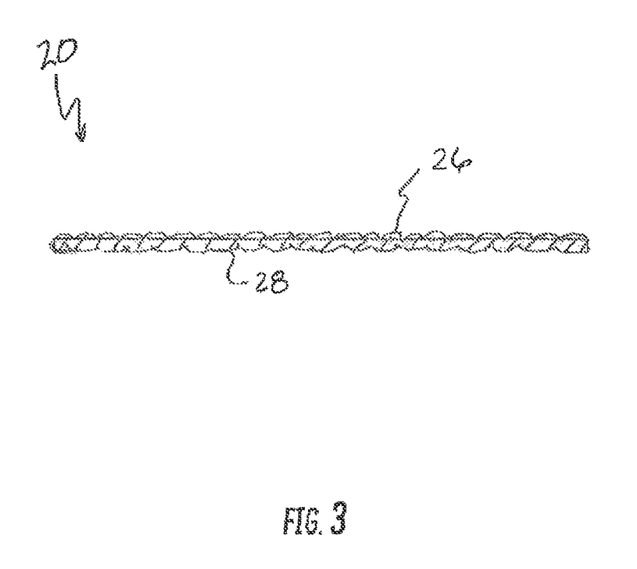
FIG. 3 is a perspective view of an embodiment of a fabric substrate made in accordance with the present disclosure.

In one embodiment, for instance, as shown in FIG. 3, a plated fabric 20 made in accordance with the present disclosure comprises a knitted fabric. In this embodiment, the knitted fabric 20 is made of interlocking loops and includes wales and courses. In accordance with the present disclosure, the fabric 20 is comprised of at least a first yarn 26 and a second yarn 28. The first yarn 26 and the second yarn 28, as shown in the embodiment illustrated in FIG. 3, are in a plated relationship such that the first yarn 26 forms a first side or face of the fabric while the second yarn 28 forms a second and opposite side or face of the fabric.

In producing the plated fabric 20, for instance, in one embodiment the first yarns 26 form first loops while the second yarns 28 form second loops. During the process of making the fabric, the knitting is repeated to produce a plurality of first loops and a plurality of second loops. The first loops are positioned substantially behind the second loops. In this manner, the plurality of first loops forms a first fabric layer exhibiting characteristics of the first yarn. The plurality of second loops, on the other hand, forms a second opposite fabric layer exhibiting characteristics of the second yarn.

For example, in one embodiment, the first yarn may comprise greater than 50% of the surface area of the first side of the fabric, such as greater than 60%, such as greater than 70%, such as greater than 80%, such as greater than 90% of the first side of the fabric. Similarly, the second yarn may comprise greater than 50% of the surface area of the second side of the fabric, such as greater than 60%, such as greater than 70%, such as greater than 80%, such as greater than 90% of the second side of the fabric.

The first yarn 26 and the second yarn 28 can be made from the same fibers or combination of fibers as described above with respect to the first outer layer 12 and the second outer layer 14 of the fabric laminate 10 shown in FIGS. 1 and 2. In one embodiment, for instance, the first yarn 26 and the second yarn 28 can each be comprised of polyester fibers, polyolefin fibers, or nylon fibers alone or in combination with cellulosic fibers (such as FR cotton fibers). If desired, elastic fibers may also be incorporated into the yarns to provide stretch properties in the amounts described previously.

In one particular embodiment, the plated fabric 20 may include inherently flame resistant fibers. For instance, in one embodiment, the first yarns 26 may comprise polyester fibers, nylon fibers, polyolefin fibers, and/or mixtures thereof. The second yarns 28, on the other hand, may comprise aramid fibers, such as meta-aramid fibers, alone or in combination with other fibers.

In one embodiment, the plated knit fabric 20 can be produced by circular knitting by using a circular knitting machine. The fabric, in one embodiment, may have a single jersey stitch construction. In other embodiments, however, the knitted fabric may have a double knit construction and/or a single faced terry loop construction. When producing a single knit or jersey knit plated fabric, the first yarn and the second yarn are generally interlocked on every wale and every course. Double knit fabrics, on the other hand, may not have the same degree of interlocking.

In some embodiments, the plated fabric may have a warp knit fabric construction. Warp knitted fabrics include, for instance, tricot fabrics, Milanese fabrics, and Raschel fabrics.

The plated fabric may comprise a woven fabric. For example, double faced woven fabrics are known in the art. In accordance with the present disclosure, the plated woven fabric can include a first yarn that is different from a second yarn. The first yarn predominately forms a first face of the fabric while the second yarn predominately forms the opposite face of the fabric. For example, in one embodiment, the woven fabric may have a twill weave that produces a plated construction.

When producing plated knit fabrics in accordance with the present disclosure, the fabrics may have various characteristic and properties depending upon the particular application. For instance, the fabrics can have a density of greater than about 10 courses per inch, such as greater than about 20 courses per inch. In one embodiment, for instance, the fabric may have a density from about 20 courses per inch to about 50 courses per inch.

Plated fabrics in accordance with the present disclosure can generally have any suitable basis weight depending upon the particular application and the desired result. For instance, the fabrics can have a basis weight of from about 2.5 OPSY to about 12 OPSY. In one embodiment, the fabric may have a relatively low weight, such as less than about 8 OPSY. In one particular embodiment, the weight of the fabric can be from about 3 OPSY to about 7 OPSY.

The fabric substrate may comprise a spacer fabric. Spacer fabrics, in one embodiment, comprise knitted fabrics that have two distinct fabric layers that are integrally connected together. In one embodiment, for instance, the spacer fabric may contain at least 3 yarns. The first yarn may be used to form a first layer of material while the second yarn may be used to form a second layer of material. A third yarn may be used to connect the first layer of material to the second layer of material.

Figure 4:
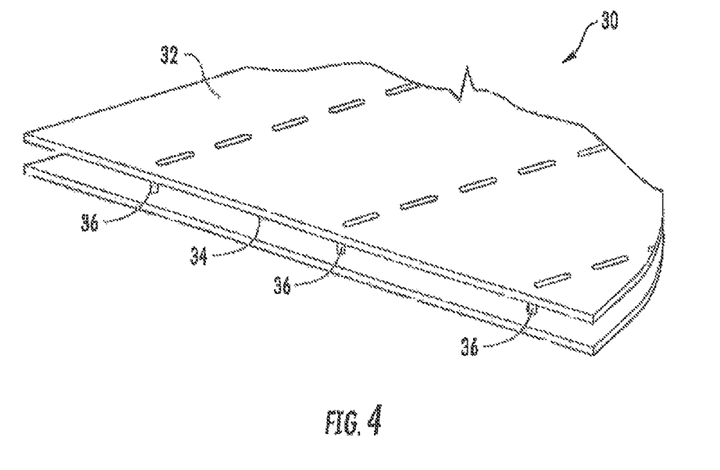
FIG. 4 is a perspective view with cutaway portions of an embodiment of a fabric substrate made in accordance with the present disclosure.

Referring to FIG. 4, for instance, a spacer fabric 30 is shown that includes a first outer fabric layer 32 and a second outer fabric layer 34. The first fabric layer 32 is connected to the second outer fabric layer 34 by a yarn 36 that, in this embodiment, forms distinct rows in between the two fabric layers.

As described above, the spacer fabric can comprise a knitted fabric. The first outer fabric layer 32 can be made from a first yarn, while the second outer fabric layer 34 can be made from a second yarn. A third yarn may be used to comprise the yarns 36. The outer fabric layers 32 and 34 can be made from the same fibers as described above with respect to the fabric laminate illustrated in FIGS. 1 and 2 and the plated fabric illustrated in FIG. 3.

A variety of fire retardant compositions can be used for application to the substrates. In general, the flame retardant composition includes one or more flame retardants in combination with auxiliary chemicals or agents. The auxiliary chemicals or agents are used for applying the flame retardant to the fabric substrate. The auxiliary agents may comprise, for instance, one or more carriers, solvents, or the like.

Flame retardants that can be used according to the present disclosure include inorganic flame retardants, such as aluminum oxide, magnesium hydroxide, and ammonium polyphosphate; halogenated flame retardants such as bromine and chlorine compounds; organophosphorus flame retardants such as phosphate esters; nitrogen-based organic flame retardants, and the like.

Chlorinated flame retardant compounds, such as chlorinated hydrocarbons, chlorinated phosphate esters, chlorinated polyphosphates, chlorinated organic phosphonates, chloroalkyl phosphates, polychlorinated biphenyls, polychlorinated dibenzo-p-dioxins and dibenzofurans are molecules containing a high concentration of chlorine that generally act chemically in the gas phase. They are often used in combination with antimony trioxide and/or zinc borate as a synergist. Three main families of chlorinated compounds include: (a) chlorinated paraffins; (b) chlorinated alkyl phosphates; and (c) chlorinated cycloaliphatic compounds.

Examples of chlorinated compounds include dodecachlorodimethano-dibenzocyclooctane, tris(2-chloroethyl)phosphate, tris(2-chloro-1-methylethyl)phosphate, tris(2-chloro-1-(chloromethyl)ethyl)phosphate (TDPP), tris(chloropropyl)phosphate, tris(dichloropropyl)phosphate, tris(2-chloroethyl)phosphite, ammonium chloride, chlorendic acid, chlorendic anhydride, tris(dichlorobropropyl)phosphite, Bis(hexachlorocyclo-pentadieno)cyclo-octane, tris-(2-chloroethyl)-phosphite, tris(dichloropropyl)phosphite, bis[bis(2-chloroethoxy)-phosphinyl]isopropylchloro-ethyl phosphate and Mirex (1,1a,2,2,3,3a,4,5,5,5a,5b,6-dodecachloroocta-hydro-1,3,4-metheno-1-H-cyclobuta(cd)pentalene).

Brominated fire retardant compounds, such as brominated organic compounds and brominated hydrocarbons, exhibit fire retardant efficiency in many materials. The three main families of brominated fire retardants include: (a) aliphatic brominated compounds; (b) aromatic brominated compounds; and (c) brominated epoxy fire retardants. Aliphatic brominated compounds include, for example, trisbromoneopentylphosphate, trisbromoneopentyl alcohol, dibromoneopentyl glycol, hexabromocyclohexane, hexabromocyclododecane, tetrabromo cyclopentane, hexabromo cyclohexane, hexabromo cyclooctane, hexabromo cyclodecane and hexabromo cyclododecane. Aromatic brominated compounds include, for example, hexabromo benzene, decabromobiphenyl, octabromodiphenyl oxide, hexabromobenzene, tris(tribromophenyl)triazine, tetrabromobisphenolA bis(2,3 dibromo propyl ether), dibromoneopentyl glycol, poly(pentabromobenzyl acrylate), pentabromodiphenyl ether, octabromodiphenyl oxide, octabromodiphenyl ether, decabromodiphenyl, decabromodiphenyl ethane, decabromodiphenyl oxide, decabromodiphenyl ether, tetrabromobisphenol A and brominated trimethylphenyl indan. Brominated epoxy fire retardants include brominated epoxy oligomers and polymers.

Other brominated fire retardant compounds include brominated diphenyl ethers, polybrominated diphenyl ethers, dimethyl-3-(hydroxymethylamino)-3-oxopropyl phosphonate, pentabromo toluene, tetrabromo chlorotoluene, pentabromo phenol, tribromo aniline, dibromobenzoic acid, pentabromotoluene, decabromodiphenyl oxide, tribromophenol, hexabromocyclododecane, brominated phosphorous, ammonium bromide, decabromobiphenyl oxide, pentabromobiphenyl oxide, decabromobiphenyl ether, 2,3-dibromopropanol, octabromobiphenyl ether, octabromodiphenyl oxide, tetrabromobiphenyl ether, hexabromocyclododecane, bis(tetrabromophthalimido)ethane, bis(tribromophenoxy)ethane, brominated polystyrene, brominated epoxy oligomer, polypentabromobenzyl acrylate, tetrabromobisphenol compounds, dibromopropylacrylate, dibromohexachlorocyclopentadienocyclooctane, $N^1$-ethyl(bis)dibromononboranedicarboxim ide, decabromodiphenyloxide, decabromodiphenyl, hexabromocyclohexane, hexabromocyclododecane, tetrabromo bisphenol A, tetrabrombisphenol S, N'N'-ethylbis(dibromononbornene) dicarboximide, hexachlorocyclopentadieno-dibromocyclooctane, tetrabromodipenta-erythritol, pentabromoethylbenzene, decabromodiphenyl ether, tetrabromophthalic anhydride, hexabromobiphenyl, octabromobiphenyl, pentabromophenyl benzoate, bis-(2,3-dibromo-1-propyl)phthalate, tris(2,3-dibromopropyl) phosphate, N,N'-ethylene-bis-(tetrabromophthalimide), tetrabromophthalic acid diol[2-hydroxypropyl-oxy-2-2-hydroxyethyl-ethyltetrabromophthalate], polybrominated biphenyls, tetrabromobisphenol A, tris(2,3-dibromopropyl)phosphate, tris(2-chloroethyl)phosphite, tris(dichlorobromopropyl) phosphite, diethyl phosphite, dicyandiamide pyrophosphate, triphenyl phosphite, ammonium dimethyl phosphate, bis(2,3-dibromopropyl)phosphate, vinylbromide, polypentabromobenzyl acrylate, decabromodiphenyl oxide, pentabromodiphenyl oxide, 2,3-dibromopropanol, octabromodiphenyl oxide, polybrominated dibenzo-p-dioxins, dibenzofurans and bromo-chlorinate paraffins.

Phosphorous-based fire retardants are compounds that include phosphorous, such as halogenated phosphates (chlorinated phosphates, brominated phosphates and the like), non-halogenated phosphates, triphenyl phosphates, phosphate esters, polyols, phosphonium derivatives, phosphonates, phosphoric acid esters and phosphate esters. Phosphorous-based fire retardants are usually composed of a phosphate core to which is bonded alkyl (generally straight chain) or aryl (aromatic ring) groups. Halogenated phosphate compounds are often introduced to decrease total halogen concentration. Non-halogenated phosphate compounds include, for example, red phosphorous, inorganic phosphates, insoluble ammonium phosphate, to ammonium polyphosphate, ammonium urea polyphosphate, ammonium orthophosphate, ammonium carbonate phosphate, ammonium urea phosphate, diammonium phosphate, ammonium melamine phosphate, diethylenediamine polyphosphate, dicyandiamide polyphosphate, polyphosphate, urea phosphate, melamine pyrophosphate, melamine orthophosphate, melamine salt of boron-polyphosphate, melamine salt of dimethyl methyl phosphonate, melamine salt of dimethyl hydrogen phosphite, ammonium salt of boron-polyphosphate, urea salt of dimethyl methyl phosphonate, organophosphates, phosphonates and phosphine oxide. Phosphate esters include, for example, trialkyl derivatives, such as triethyl phosphate and trioctyl phosphate, triaryl derivatives, such as triphenyl phosphate, and aryl-alkyl derivatives, such as 2-ethylhexyl-diphenyl phosphate.

Other examples of phosphorous-based fire retardants include methylamine boron-phosphate, cyanuramide phosphate, cresyl diphenyl phosphate, tris(1-chloro-2-propyl) phosphate, tris(2-chloroethyl)phosphate, tris(2,3-dibromopropyl)phosphate, triphenyl phosphate, magnesium phosphate, tricresyl phosphate, hexachlorocyclopentadiene, isopropyl triphenyl phosphate, tricresol phosphate, ethanolamine dimethyl phosphate, cyclic phosphonate ester, monoammonium phosphate and diammonium phosphate, which permit a char formation as a result of esterification of hydroxyl groups with the phosphoric acid, trialkyl phosphates and phosphonates, such as triethyl phosphate and dimethyl, aryl phosphates, such as triaryl phosphates, isopropyl triphenyl phosphate, octylphenyl phosphate, triphenylphosphate, ammonium phosphates, such as ammonium phosphate, ammonium polyphosphate and potassium ammonium phosphate, cyanuramide phosphate, aniline phosphate, trimethylphosphoramide, tris(1-aziridinyl)phosphine oxide, triethylphosphate, Bis(5,5-dimethyl-2-thiono-1,3,2-dioxaphosphorinamyl)oxide, Bis(2-chloroethyl)vinyl phosphate, dimethylphosphono-N-hydroxymethyl-3-propionamide, tris(chloropropyl)phosphate, tris(2-butoxyethyl) phosphate, tris(2-chloroethyl)phosphate, tris(2-ethylhexyl) phosphate, tris(chloropropyl)phosphate, tetrakis(hydroxymethyl)phosphonium salts, such as tetrakis(hydroxymethyl)phosphonium chloride and tetrakis(hydroxymethyl)phosphonium sulfate, n-hydroxymethyl-3-(dimethylphosphono)-propionamide, urea phosphate, melamine pyrophosphate, a melamine salt of boron-polyphosphate, an ammonium salt of boron-polyphosphate, dicyandiamide pyrophosphate, triphenyl phosphite, ammonium dimethyl phosphate, fyroltex HP, melamine orthophosphate, ammonium urea phosphate, ammonium melamine phosphate, a urea salt of dimethyl methyl phosphonate, a melamine salt of dimethyl methyl phosphonate, a melamine salt of dimethyl hydrogen phosphite, polychlorinated biphenyls, a variety of alkyl diaryl phosphates and mixtures of monomeric chloroethyl phosphonates and high boiling phosphonates.

Metal hydroxide fire retardants include inorganic hydroxides, such as aluminum hydroxide, magnesium hydroxide, aluminum trihydroxide (ATH) and hydroxycarbonate.

Melamine-based fire retardants are a family of non-halogenated flame retardants that include three chemical groups: (a) melamine(2,4,6-triamino-1,3,5 triazine); (b) melamine derivatives (including salts with organic or inorganic acids, such as boric acid, cyanuric acid, phosphoric acid or pyro/poly-phosphoric acid); and (c) melamine homologues. Melamine derivatives include, for example, melamine cyanurate (a salt of melamine and cyanuric acid)), melamine-mono-phosphate (a salt of melamine and phosphoric acid), melamine pyrophosphate and melamine polyphosphate. Melamine homologues include melam(1,3,5-triazin-2,4,6-triamine-n-(4,6-diamino-1,3,5-triazine-2-yl), melem(2,5,8-triamino 1,3,4,6,7,9,9b-heptaazaphenalene) and melon (poly[8-amino-1,3,4,6,7,9,9b-heptaazaphenalene-2,5-diyl).

Borate fire retardant compounds include zinc borate, borax (sodium borate), ammonium borate, and calcium borate. Zinc borate is a boron-based fire retardant having the chemical composition $xZnO_yB_2O_3zH_2O$, with the most commonly used grade having the structure $2ZnO.3B_2O_3zH_2.3,5H_2O$. Zinc borate can be used alone, or in conjunction with other chemical compounds, such as antimony oxide, alumina trihydrate, magnesium hydroxide or red phosphorous. It acts through zinc halide or zinc oxyhalide, which accelerate the decomposition of halogen sources and promote char formation.

Silicon-based materials include linear and branched chain-type silicone with (hydroxy or methoxy) or without (saturated hydrocarbons) functional reactive groups.

Phosphonic acid derivatives include phosphonic acid, ethylenediamine salt of phosphonic acid, tetrakis hydroxymethyl phosphonium chloride and n-methyl dimethylphosphono propionamide.

Examples of intumescent substances include, but are not limited to, ammonium polyphosphate, boric acid, chlorinated paraffin, DI-pentaerythritol, melamine, to monoammonium phosphate, pentaerythritol, phosphate esters, polytetrafluoroethylene, tributoxyethyl phosphate, triethyl phosphate, tris(2-ethylhexyl)phosphonate, urea, xylene and zinc borate.

Examples of powdered metal containing flame retardant substances, which can be employed alone or in combination with other flame retardant substances, include, but are not limited to, magnesium oxide, magnesium chloride, talcum, alumina hydrate, zinc oxide, zinc borate, alumina trihydrate, alumina magnesium, calcium silicate, sodium silicate, zeolite, magnesium hydroxide, sodium carbonate, calcium carbonate, ammonium molybdate, iron oxide, copper oxide, zinc phosphate, zinc chloride, clay, sodium dihydrogen phosphate, tin, molybdenum and zinc.

Examples of fire retardant substances also include boric acid, boron oxide, calcium borate, alumina trihydrate(alumina hydroxide), alumina carbonate, hydrated aluminum, aluminum hydroxide, antimony oxide, antimony trioxide, antimony pentoxide, sodium antimonate, magnesium carbonate, potassium fluorotitanate, potassium fluorozirconate, zinc oxide, hunite-hydromagnesite, ammonium octamolybdate, ammonium bromide, ammonium sulfate, ammonium carbonate, ammonium oxylate, barium metaborate, molybdenum trioxide, zinc hydroxystannate, sodium tungstate, sodium antimonate, sodium stannate, sodium aluminate, sodium silicate, sodium bisulfate, ammonium borate, ammonium iodide, tin compounds, molybdic oxide, sodium antimonate, ammonium sulfamate, ammonium silicate, quaternary ammonium hydroxide, aluminium tryhydroxide, tetrabromobisphenol A, titanium compounds, zirconium compounds, other zinc compounds, such as zinc stannate and zinc hydroxy-stannate, dioxins, diethyl phosphite, methylamine boron-phosphate, cyanoquanidine, thiourea, ethyl urea, dicyandiamide and halogen-free phosphonic acid derivatives.

In one embodiment, flame retardant substances for use in the processes, systems, compositions and substrates of the present invention include boric acid, sodium borate, decabromodiphenyl ether, hexabromocyclododecane, potassium fluorotitanate, potassium fluorozirconate, ammonium bromide, aluminium hydrate, halogenated compounds (polybrominated diphenyl ethers, chlorinated paraffins and the like), organic phosphates(tri-alkyl phosphates, tri-aryl phosphates, trichioroalkyl phosphates, dialkyl phosphites, tetrakis(hydroxymethyl)phosphonium chloride and the like), ammonium carbonate phosphate, di-ammonium to phosphate, sodium tungstate, pentabromodiphenyl ether, pentabromotoluene, tetrabromophthalic acid diol[2-hydroxypropyl-oxy-2-2-hydroxyethyl-ethyltetrabromophthalate], tetrabromophthalic anhydride, N,N'-ethylene-bis-(tetrabromophthalimide), bromo-chlorinate paraffins, dimethylphosphono-N-hydroxymethyl-3-propionamide, cyclic phosphonate ester, dimethyl-3-(hydroxymethylamino)-3-oxopropyl phosphonate, Bis(5,5-dimethyl-2-thiono-1,3,2-dioxaphosphorinamyl)oxide, Bis(2-chloroethyl)vinyl phosphate, sodium stannate, sodium aluminate, sodium silicate, sodium bisulfate, ammonium borate, ammonium polyphosphate, ammonium iodide, dibromopropylacrylate, tetrabromodipenta-erythritol, pentabromoethylbenzene, tris(2,3-dibromopropyl)phosphate, tris(dichloropropyl)phosphite, bis-(2,3-dibromo-1-propyl)phthalate, trimethylphosphoramide, tris(1-aziridinyl)phosphine oxide, bis[bis(2-chloroethoxy)-phosphinyflisopropylchloro-ethyl phosphate, tris (dichloropropyl)phosphite, tris-(2-chloroethyl)-phosphite, polybrominated diphenyl ethers, intumescent chemicals, alumina trihydrate, brominated aromatic organic compounds, and brominated cycloaliphatic organic compounds.

In another embodiment, flame retardant substances for use in the processes, systems, compositions and substrates of the invention are phosphoric acid, halogen-free phosphoric acid derivatives (such as ammonium polyphosphate or triarylphosphate esters), phosphonic acid, halogen-free phosphonic acid derivatives (such as 3-(dimethylphosphono) proprionic acid methyl amide), ammonia, ammonia phosphate, ammonium molybdate, ammonium borate, organophosphorus chemicals (such as triethyl or trioctyl phosphate, triaryl derivatives, including triphenyl phosphate, and aryl-alkyl derivatives, such as 2-ethylhexyldiphenyl phosphate), melamine, melamine chemicals (such as cyanurotriamide, cyanotriamine, melamine cyuranat, melamine borate, melamine pyrophosphate, melamine polyphosphate or isomelamine), intumescent chemicals, alumina trihydrate, urea, guanidine, dicyandiamide, ethyl urea, ethylamine, thiourea, diethylenediamine, ethylenediamine, brominated aromatic organic compounds (such as tetrabromobisphenol or decabromodiphenyl ether), brominated cycloaliphatic organic compounds (such as hexabromocyclododecane) and various mixtures thereof.

In one embodiment, a cyclic phosphazene derivative may be used as the flame retardant. Cyclic phosphazene derivatives include: 1,1,3,3,5,5-hexa(methoxy)cyclotriphosphazene, 1,1,3,3,5,5-hexa(ethoxy)cyclotriphosphazene, 1,1,3,3,5,5-hexa(n-propoxy)cyclotriphosphazene, 1,1,3,3,5,5-hexa(iso-propoxy)cyclotriphosphazene, 1,1,3,3,5,5-hexa(n-butoxy)cyclotriphosphazene, 1,1,3,3,5,5-hexa(iso-butoxy)cyclotriphosphazene, 1,1,3,3,5,5-hexa(phenoxy)cyclotriphosphazene, 1,1,3,3,5,5-hexa(p-tolyloxy)cyclotriphosphazene, 1,1,3,3,5,5-hexa(m-tolyloxy)cyclotriphosphazene, 1,1,3,3,5,5-hexa(o-tolyloxy)cyclotriphosphazene, 1,1,3,3,5,5-hexa(p-anisyloxy)cyclotriphosphazene, 1,1,3,3,5,5-hexa(m-anisyloxy)cyclotriphosphazene, 1,1,3,3,5,5-hexa(o-anisyloxy)cyclotriphosphazene, 1,1,3,3,5,5-hexa(4-ethylphenoxy)cyclotriphosphazene, 1,1,3,3,5,5-hexa(4-n-propylphenoxy)cyclotriphosphazene, 1,1,3,3,5,5-hexa(4-iso-propylphenoxy)cyclotriphosphazene, 1,1,3,3,5,5-hexa(4-tert-butylphenoxy)cyclotriphosphazene, 1,1,3,3,5,5-hexa(4-tert-octylphenoxy)cyclotriphosphazene, 1,1,3,3,5,5-hexa(2,3-dimethylphenoxy)cyclotriphosphazene, 1,1,3,3,5,5-hexa(2,4-dimethylphenoxy)cyclotriphosphazene, 1,1,3,3,5,5-hexa(2,5-dimethylphenoxy)cyclotriphosphazene, 1,1,3,3,5,5-hexa(2,6-dimethylphenoxy)cyclotriphosphazene, 1,1,3,3,5,5-hexaaminocyclotriphosphazene, 1,1,3,3,5,5-hexa(4-phenylphenoxy)cyclotriphosphazene, 1,3,5-tris(methoxy)-1,3,5-tris(phenoxy)cyclotriphosphazene, 1,3,5-tris(ethoxy)-1,3,5-tris(phenoxy)cyclotriphosphazene, 1,3,5-tris(n-propoxy)-1,3,5-tris(phenoxy)cyclotriphosphazene, 1,3,5-tris(iso-propoxy)-1,3,5-tris(phenoxy)cyclotriphosphazene, 1,3,5-tris(n-butoxy)-1,3,5-tris(phenoxy)cyclotriphosphazene, 1,3,5-tris(iso-butoxy)-1,3,5-tris(phenoxy)cyclotriphosphazene, 1,3,5-tris(methoxy)-1,3,5-tris(p-tolyloxy)cyclotriphosphazene, 1,3,5-tris(methoxy)-1,3,5-tris(m-tolyloxy)cyclotriphosphazene, 1,3,5-tris(methoxy)-1,3,5-tris(o-tolyloxy)cyclotriphosphazene, 1,3,5-tris(methoxy)-1,3,5-tris(p-anisyloxy)cyclotriphosphazene, 1,3,5-tris(methoxy)-1,3,5-tris(m-anisyloxy)cyclotriphosphazene, 1,3,5-tris(methoxy)-1,3,5-tris(o-anisyloxy)cyclotriphosphazene, 1,3,5-tris(ethoxy)-1,3,5-tris(p-tolyloxy)cyclotriphosphazene, 1,3,5-tris(ethoxy)-1,3,5-tris(m-tolyloxy)cyclotriphosphazene, 1,3,5-tris(ethoxy)-1,3,5-tris(o-tolyloxy)cyclotriphosphazene, 1,3,5-tris(ethoxy)-1,3,5-tris(p-anisyloxy)cyclotriphosphazene, 1,3,5-tris(ethoxy)-1,3,5-tris(m-anisyloxy)cyclotriphosphazene, 1,3,5-tris(ethoxy)-1,3,5-tris(o-anisyloxy)cyclotriphosphazene, 1,3,5-tris(n-propoxy)-1,3,5-tris(p-tolyloxy)cyclotriphosphazene, 1,3,5-tris(n-propoxy)-1,3,5-tris(m-tolyloxy)cyclotriphosphazene, 1,3,5-tris(n-propoxy)-1,3,5-tris(o-tolyloxy)cyclotriphosphazene, 1,3,5-tris(n-propoxy)-1,3,5-tris(p-anisyloxy)cyclotriphosphazene, 1,3,5-tris(n-propoxy)-1,3,5-tris(m-anisyloxy)cyclotriphosphazene, 1,3,5-tris(n-propoxy)-1,3,5-tris(o-anisyloxy)cyclotriphosphazene, 1,3,5-tris(iso-propoxy)-1,3,5-tris(p-tolyloxy)cyclotriphosphazene, 1,3,5-tris(n-butoxy)-1,3,5-tris(p-tolyloxy)cyclotriphosphazene, 1,3,5-tris(iso-butoxy)-1,3,5-tris(p-tolyloxy)cyclotriphosphazene, 1,3,5-tris(methoxy)-1,3,5-tris(4-tert-butylphenoxy)cyclotriphosphazene, 1,3,5-tris(methoxy)-1,3,5-tris(4-tert-octylphenoxy)cyclotriphosphazene, 1,3,5-tris(n-propoxy)-1,3,5-tris(4-tert-butylphenoxy)cyclotriphosphazene, 1,3,5-tris(n-propoxy)-1,3,5-tris(4-tert-octylphenoxy)cyclotriphosphazene, 1,3,5-tris(methoxy)-1,3,5-tris(4-phenylphenoxy)cyclotriphosphazene, 1,3,5-tris(ethoxy)-1,3,5-tris(4-phenylphenoxy)cyclotriphosphazene, 1,3,5-tris(n-propoxy)-1,3,5-tris(4-phenylphenoxy)cyclotriphosphazene, 1,3,5-tris(iso-propoxy)-1,3,5-tris(4-phenylphenoxy)cyclotriphosphazene, 1,3,5-tris(n-butoxy)-1,3,5-tris(4-phenylphenoxy)cyclotriphosphazene, 1,3,5-tris(iso-butoxy)-1,3,5-tris(4-phenylphenoxy)cyclotriphosphazene, 1,1-diamino-3,3,5,5-tetrakis(methoxy)cyclotriphosphazene, 1,1-diamino-3,3,5,5-tetrakis(ethoxy)cyclotriphosphazene, 1,1-diamino-3,3,5,5-tetrakis(n-propoxy)cyclotriphosphazene, 1,1-diamino-3,3,5,5-tetrakis(iso-propoxy)cyclotriphosphazene, 1,1-diamino-3,3,5,5-tetrakis(n-butoxy)cyclotriphosphazene, 1,1-diamino-3,3,5,5-tetrakis(iso-butoxy)cyclotriphosphazene, 1,1-diamino-3,3,5,5-tetrakis(phenoxy)cyclotriphosphazene, 1,1-diamino-3,3,5,5-tetrakis(p-tolyloxy)cyclotriphosphazene, 1,1-diamino-3,3,5,5-tetrakis(m-tolyloxy)cyclotriphosphazene, 1,1-diamino-3,3,5,5-tetrakis(o-tolyloxy)cyclotriphosphazene, 1,1-diamino-3,3,5,5-tetrakis(p-anisyloxy)cyclotriphosphazene, 1,1-diamino-3,3,5,5-tetrakis(m-anisyloxy)cyclotriphosphazene, 1,1-diamino-3,3,5,5-tetrakis(o-anisyloxy)cyclotriphosphazene, and 1,1-diamino-3,3,5,5-tetrakis(4-phenylphenoxy)cyclotriphosphazene.

Examples of the linear phosphazene derivatives include 1,1,3,3,5,5-hexa(methoxy)triphosphazene, 1,1,3,3,5,5-hexa(ethoxy)triphosphazene, 1,1,3,3,5,5-hexa(n-propoxy)triphosphazene, 1,1,3,3,5,5-hexa(iso-propoxy)triphosphazene, 1,1,3,3,5,5-hexa(n-butoxy)triphosphazene, 1,1,3,3,5,5-hexa(iso-butoxy)triphosphazene, 1,1,3,3,5,5-hexa(phenoxy)triphosphazene, 1,1,3,3,5,5-hexa(p-tolyloxy)triphosphazene, 1,1,3,3,5,5-hexa(m-tolyloxy)triphosphazene, 1,1,3,3,5,5-hexa(o-tolyloxy)triphosphazene, 1,1,3,3,5,5-hexa(p-anisyloxy)triphosphazene, 1,1,3,3,5,5-hexa(m-anisyloxy)triphosphazene, 1,1,3,3,5,5-hexa(o-anisyloxy)triphosphazene, 1,1,3,3,5,5-hexa(4-ethylphenoxy)triphosphazene, 1,1,3,3,5,5-hexa(4-n-propylphenoxy)triphosphazene, 1,1,3,3,5,5-hexa(4-iso-propylphenoxy)triphosphazene, 1,1,3,3,5,5-hexa(4-tert-butylphenoxy)triphosphazene, 1,1,3,3,5,5-hexa(4-tert-octylphenoxy)triphosphazene, 1,1,3,3,5,5-hexa(2,3-dimethylphenoxy)triphosphazene, 1,1,3,3,5,5-hexa(2,4-dimethylphenoxy)triphosphazene, 1,1,3,3,5,5-hexa(2,5-dimethylphenoxy)triphosphazene, 1,1,3,3,5,5-hexa(2,6-dimethylphenoxy)triphosphazene, 1,1,3,3,5,5-hexaaminotriphosphazene, 1,1,3,3,5,5-hexa(4-phenylphenoxy)triphosphazene, 1,3,5-tris(methoxy)-1,3,5-tris(phenoxy)triphosphazene, 1,3,5-tris(ethoxy)-1,3,5-tris(phenoxy)triphosphazene, 1,3,5-tris(n-propoxy)-1,3,5-tris(phenoxy)triphosphazene, 1,3,5-tris(iso-propoxy)-1,3,5-tris(phenoxy)triphosphazene, 1,3,5-tris(n-butoxy)-1,3,5-tris(phenoxy)triphosphazene, 1,3,5-tris(iso-butoxy)-1,3,5-tris(phenoxy)triphosphazene, 1,3,5-tris(methoxy)-1,3,5-tris(p-tolyloxy)triphosphazene, 1,3,5-tris(methoxy)-1,3,5-tris(m-tolyloxy)triphosphazene, 1,3,5-tris(methoxy)-1,3,5-tris(o-tolyloxy)triphosphazene, 1,3,5-tris(methoxy)-1,3,5-tris(p-anisyloxy)triphosphazene, 1,3,5-tris(methoxy)-1,3,5-tris(m-anisyloxy)triphosphazene, 1,3,5-tris(methoxy)-1,3,5-tris(o-anisyloxy)triphosphazene, 1,3,5-tris(ethoxy)-1,3,5-tris(p-tolyloxy)triphosphazene, 1,3,5-tris(ethoxy)-1,3,5-tris(m-tolyloxy)triphosphazene, 1,3,5-tris(ethoxy)-1,3,5-tris(o-tolyloxy)triphosphazene, 1,3,5-tris(ethoxy)-1,3,5-tris(p-anisyloxy)triphosphazene, 1,3,5-tris(ethoxy)-1,3,5-tris(m-anisyloxy)triphosphazene, 1,3,5-tris(ethoxy)-1,3,5-tris(o-anisyloxy)triphosphazene, 1,3,5-tris(n-propoxy)-1,3,5-tris(p-tolyloxy)triphosphazene, 1,3,5-tris(n-propoxy)-1,3,5-tris(m-tolyloxy)triphosphazene, 1,3,5-tris(n-propoxy)-1,3,5-tris(o-tolyloxy)triphosphazene, 1,3,5-tris(n-propoxy)-1,3,5-tris(p-anisyloxy)triphosphazene, 1,3,5-tris(n-propoxy)-1,3,5-tris(m-anisyloxy)triphosphazene, 1,3,5-tris(n-propoxy)-1,3,5-tris(o-anisyloxy)triphosphazene, 1,3,5-tris(iso-propoxy)-1,3,5-tris(p-tolyloxy)triphosphazene, 1,3,5-tris(n-butoxy)-1,3,5-tris(p-tolyloxy)triphosphazene, 1,3,5-tris(iso-butoxy)-1,3,5-tris(p-tolyloxy)triphosphazene, 1,3,5-tris(methoxy)-1,3,5-tris(4-tert-butylphenoxy)triphosphazene, 1,3,5-tris(methoxy)-1,3,5-tris(4-tert-octylphenoxy)triphosphazene, 1,3,5-tris(n-propoxy)-1,3,5-tris(4-tert-butylphenoxy)triphosphazene, 1,3,5-tris(n-propoxy)-1,3,5-tris(4-tert-octylphenoxy)triphosphazene, 1,3,5-tris(methoxy)-1,3,5-tris(4-phenylphenoxy)triphosphazene, 1,3,5-tris(ethoxy)-1,3,5-tris(4-phenylphenoxy)triphosphazene, 1,3,5-tris(n-propoxy)-1,3,5-tris(4-phenylphenoxy)triphosphazene, 1,3,5-tris(iso-propoxy)-1,3,5-tris(4-phenylphenoxy)triphosphazene, 1,3,5-tris(n-butoxy)-1,3,5-tris(4-phenylphenoxy)triphosphazene, 1,3,5-tris(iso-butoxy)-1,3,5-tris(4-phenylphenoxy)triphosphazene, 1,1-diamino-3,3,5,5-tetrakis(methoxy)triphosphazene, 1,1-diamino-3,3,5,5-tetrakis(ethoxy)triphosphazene, 1,1-diamino-3,3,5,5-tetrakis(n-propoxy)triphosphazene, 1,1-diamino-3,3,5,5-tetrakis(iso-propoxy)triphosphazene, 1,1-diamino-3,3,5,5-tetrakis(n-butoxy)triphosphazene, 1,1-diamino-3,3,5,5-tetrakis(iso-butoxy)triphosphazene, 1,1-diamino-3,3,5,5-tetrakis(phenoxy)triphosphazene, 1,1-diamino-3,3,5,5-tetrakis(p-tolyloxy)triphosphazene, 1,1-diamino-3,3,5,5-tetrakis(m-tolyloxy)triphosphazene, 1,1-diamino-3,3,5,5-tetrakis(o-tolyloxy)triphosphazene, 1,1-diamino-3,3,5,5-tetrakis(p-anisyloxy)triphosphazene, 1,1-diamino-3,3,5,5-tetrakis(m-anisyloxy)triphosphazene, 1,1-diamino-3,3,5,5-tetrakis(o-anisyloxy)triphosphazene, and 1,1-diamino-3,3,5,5-tetrakis(4-phenylphenoxy)triphosphazene.

In yet another embodiment of the present disclosure, the flame retardant comprises an aromatic bromine compound. For instance, in one embodiment, the flame retardant comprises pentabromobenzylbromide.

The manner in which the flame retardant composition is applied to the fabric substrate can vary. In one embodiment, for instance, the flame retardant composition can be printed or sprayed onto a substrate. The flame retardant can be padded onto the fabric substrate, in some embodiments.

Figure 5:
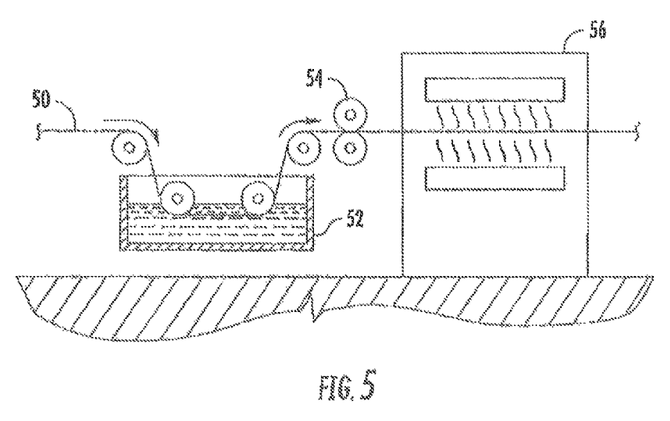
FIG. 5 is a cross-sectional view of one embodiment of a process that may be used to treat fabric substrates in accordance with the present disclosure.

FIG. 5 illustrates one embodiment of a process that may be used in accordance with the present disclosure. In the set of embodiments illustrated in FIG. 5, a fabric is treated with the flame retardant composition. It should be understood, however, that alternatively the yarns used to produce the fabric may be similarly treated.

In the set of embodiments illustrated in FIG. 5, a fabric substrate 50 made in accordance with the present disclosure is dipped into a bath 52. The fabric substrate 50 may comprise any of the above described fabric substrates including those illustrated in FIGS. 1-4. When producing fabric laminates such as those shown in FIGS. 1 and 2, the fabric substrate 50 may comprise a single fabric ply that is then later used to form the fabric laminate.

The bath 52 generally contains the flame retardant composition. The flame retardant composition, however, may also be applied by padding, spraying, printing, and the like.

As shown in FIG. 5, after impregnation, some of the excess flame retardant composition may be removed by feeding the fabric substrate through a nip.

Once the fabric substrate 50 is impregnated with the flame retardant composition, the fabric substrate can be dried. In one embodiment, for instance, the fabric substrate can be fed through a drying device 56 as shown in FIG. 5. The drying device 56 may comprise, for instance, any suitable oven, infrared heater, or the like. The drying device 56 may also be designed to flow warm air in and around the fabric.

Particular embodiments of flame retardant compositions and processes for applying the compositions to the fabric substrate will now be described.

For instance, in one embodiment, the flame retardant may be in the form of a solid that is dissolved or not dissolved in an aqueous or non-aqueous liquid. One or more flame retardants may be contained in the liquid carrier in amounts ranging from 0.5 to about 75% by weight, such as from about 10% to about 50% by weight. In general, the one or more flame retardants contained in the flame retardant composition are present in the composition and applied to the fabric substrate in manners that completely saturate or apply as much as possible of the flame retardants to the substrate.

In one embodiment, the fabric substrate is padded with a flame retardant composition containing a phosphonium sulfate. The wet pick up of the fabric can be from about 20% to about 40% by weight. The fabric substrate can then be subsequently subjected to an ammonia cure process.

In another embodiment, the fabric substrate of the present disclosure is treated with a flame retardant composition containing hexabromocyclododecane. The flame retardant can be applied to the yarns or to the fabric substrate as a dispersion at elevated temperatures above its melting point and then cooled. In this manner, the flame retardant becomes fused to the synthetic fiber.

In another embodiment, the fabric substrate can be treated with a cyclic phosphonate ester in the manner described above.

In yet another embodiment of the present disclosure, the fabric substrate is dipped into a bath containing the flame retardant composition. The flame retardant composition contains a flame retardant comprising a phosphate compound.

The phosphate, for instance, may comprise a tetrakis (hydroxyorgano) phosphonium salt, a hydroxymethyl phosphine, an aluminum amidophosphate, a bromophosphate such as tris (2,3-dibromopropyl) phosphate or bis (2,3-dibromopropyl) phosphate or bis (1,3-dibromopropyl isopropyl) phosphate, a chromium acid phosphate or mixtures thereof. Salts which may be employed to produce the phosphate include, for instance, halides, sulfates, acetates, phosphates, carboxylates, oxalates, lactates, formates, sulfonates, and nitrates. Particular phosphates that may be present in the bath include tetra-(hydroxymethyl) phosphonium chloride or tetrakis (hydroxymethyl) phosphonium sulfate.

In one embodiment, a base such as a weak base may be present in the bath. The base may comprise an alkaline metal hydroxide, an alkaline earth hydroxide, monoalkaline metal salts of dibasic acid, organic tertiary amines and the like. The ph of the bath can be, for instance, from about 2 to about 9, such as from about 5 to about 8.5.

In one embodiment, a nitrogen-containing compound may also be present that may react with the phosphate compound. The nitrogen-containing compound may comprise, for instance, urea including substituted ureas. Other nitrogen-containing compounds include a guanidine, a melamine, or other amino or amido function containing organic compounds.

In addition to the phosphate compound, the flame retardant composition contained within the bath may contain various other components. For instance, in addition to the base and/or nitrogen containing compound, the flame retardant composition can also contain a solvent such as water or an alcohol. The phosphorus compound can be present in the impregnating solution contained in the bath in an amount generally from about 5% by weight to 70% by weight or greater.

The fabric is dipped into the bath in order to impregnate the fabric. The flame retardant composition, however, may also be applied by padding, spraying and the like. After impregnation, excess composition may be removed by using a pair of squeeze rolls.

Once the fabric is impregnated with the fire retardant composition, the wet pick up may vary dramatically depending upon the particular fabric, the phosphorus compound contained in the bath, and various other factors. In one embodiment, the wet pick up of the phosphorous compound may be controlled so as to maximize the amount of phosphorous compound incorporated into the fabric. The wet pick up, for instance, can be from about 30% by weight to about 200% by weight of the fabric. In one embodiment, for instance, the wet pick up may be from about 70% by weight to about 130% by weight of the fabric.

The fabric, once impregnated with the flame retardant composition, can be dried if desired. In one embodiment, for instance, the fabric can be fed through a drying device. The drying device may comprise, for instance, any suitable oven, infrared heater, microwave device, or the like. Alternatively, the drying device may be designed to flow warm air in and around the fabric.

Once dried, the fabric may contain the flame retardant composition in an amount up to about 20% by weight, such as from about 0.5% to about 8% by weight, such as from about 0.5 to about 3% by weight.

The drying device can completely dry the fabric or partially dry the fabric. For instance, in one embodiment, at least 80% of the water contained in the fabric may be removed by the drying device.

After exiting the drying device, the fabric is then fed to a second bath. The second bath can contain a polymerizing agent that causes the phosphate compound to polymerize on the fabric. The polymerizing agent, for instance, may comprise a compound having at least one-NHR group, where R is a hydrogen or an organic radical or a phosphoro-oxygen radical. In one embodiment, for instance, the polymerizing agent comprises ammonia, such as anhydrous ammonia.

In one embodiment, the anhydrous ammonia is present in an excess amount sufficient to completely polymerize the phosphate. Excess ammonia can then be converted to ammonia hydroxide with the addition of water and used in conjunction with peroxide to oxide the phosphorus polymer. The oxidation step also converts any formaldehyde formed during the process to formic acid. The peroxide may be present in the second bath or may be contacted with the fabric in a subsequent step. For instance, the process may include a third bath containing an oxidizing agent, such as peroxide.

As described above, the fabric is dipped into a solution containing ammonia. In other embodiments, however, the ammonia may be applied to the fabric as a vapor. For instance, in one embodiment, ammonia may be combined with steam and contacted with the fabric within a chamber.

After exiting the second bath, the fabric enters a second pair of squeeze rolls and then fed to a second drying device. The second drying device may be substantially the same or different than the drying device.

In yet another embodiment of the present disclosure, a fabric substrate or yarns are fed around rollers or similar devices and into a pad bath containing a phosphorus-based flame retardant treatment composition. The treatment composition contains a hydroxymethyl phosphonium composition, such as a bath of THP, THPOH, or THPOH-urea precondensate. As the fabric travels through the pad bath, it is saturated with the treatment composition and then passes through a nip which squeezes the fabric and forces the treatment composition into the fabric. The fabric can then be immersed in a second treatment composition after the initial dip-squeeze treatment to once again become thoroughly saturated with the treatment composition. It then passes through a second nip which again squeezes the fabric and forces the treatment composition into the fabric. The fabric then emerges from the pad bath and is directed to a curing operation.

In the above embodiments, the fabric substrate is treated in two separate, successively arranged pad baths. Each pad bath can contain the same treatment composition or can contain a different treatment composition which may differ, for instance, in concentration, composition, or both. During the process, the phosphonium compound is cured and becomes insoluble and durably affixed to the fabric.

In still another embodiment of the present disclosure, the yarn and/or fabric is treated with an aqueous solution of ammonium sulfate, a metasilicate salt serving as a binder, and ammonium phosphate, such as monoammonium phosphate or diammonium phosphate. An ultraviolet inhibitor may also be included in the composition.

In one embodiment, for instance, the composition may contain about 1 part sodium metasilicate, 13 parts of ammonium sulfate, about 4 parts of ammonium phosphate, and the rest water. The fabric can be blended in the composition and then dried and cured. The amount of sodium metasilicate used in the composition is sufficient for adequate bonding of the ammonium sulfate. In certain embodiments, a weak acid can be added to the solution.

Fabric substrates made according to the present disclosure may also undergo various treatments and finishing processes. In one embodiment, for instance, a durable water-repellent (DWR) treatment may be applied to the fabric. Of particular advantage, the durable water-repellent treatment can be applied to the fabric without significantly adversely impacting upon the flame resistant properties of the product. In general, a durable water repellent treatment comprises a coating or finish applied to the fabric product that is hydrophobic and that makes the product water-resistant. Examples of durable water-repellent treatments include silicone resin emulsions and various fluoropolymer-based treatments. Commercially available durable water repellent treatments include, for instance, ZONYL fluorochemicals available from E.I. DuPont de Nemours and Company. Other commercially available durable water repellent treatments include UNIDYNE fluorochemicals available from Daikin America, Inc. Various additives suitable for imparting low surface tension fluid repellency to articles containing polymeric fibers are disclosed in U.S. Pat. No. 5,145,727, U.S. Pat. No. 5,178,931, U.S. Pat. No. 4,855,360, U.S. Pat. No. 4,863,983, U.S. Pat. No. 5,798,402, U.S. Pat. No. 5,459,188, and U.S. Pat. No. 5,025,052, which are all incorporated herein by reference.

In addition to a durable water repellent treatment, fabric products made according to the present disclosure may also be dyed and printed. In one embodiment, for instance, the fabric product can be printed with a camouflage pattern. The camouflage pattern, for instance, may have a 2 to 7 color scheme. In one embodiment, the camouflage pattern may have reflectance levels of from about 20% to about 60% in the region of wavelengths of from about 600 nm to about 1200 nm, such as from about 600 nm to about 900 nm.

Fabric products made according to the present disclosure have been found to exhibit a very desirable combination of characteristics and thermal protective properties. Certain fabric products are especially useful for constructing apparel and other similar articles designed to protect against the threat of a flash fire, an electric arc, or the like.

Fabrics made according to the present disclosure can be used to form all different types of articles and products. In one embodiment, for instance, the fabrics can be used to make apparel and other garments. Such apparel can include jackets, shirts, coats, pants, bib overhauls, gloves, hats, face shields, socks, shoes, boots and the like. The fabric can be used to form an entire article of clothing or can be used to form a certain part of the clothing. For instance, the fabric can be used as sleeve fabric for a shirt. In an alternative embodiment, the fabric can be used as a shell fabric for a garment, such as a coat or a jacket. In still another embodiment, the fabric can be used to produce the entire garment.

Figure 6:
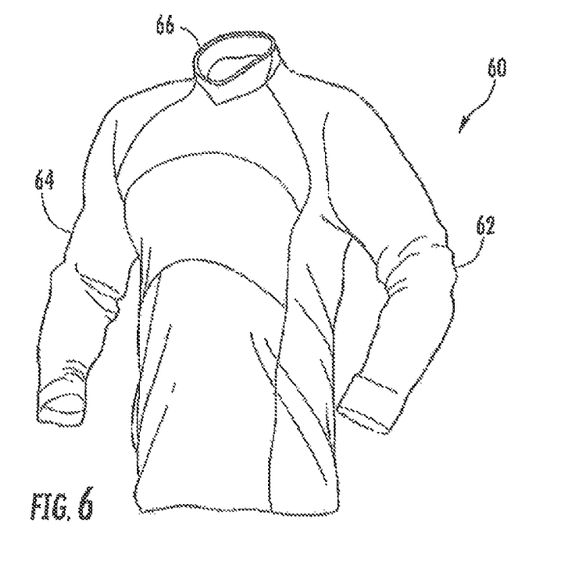
FIG. 6 is a perspective view of one embodiment of a garment made in accordance with the present disclosure.
Figure 7:
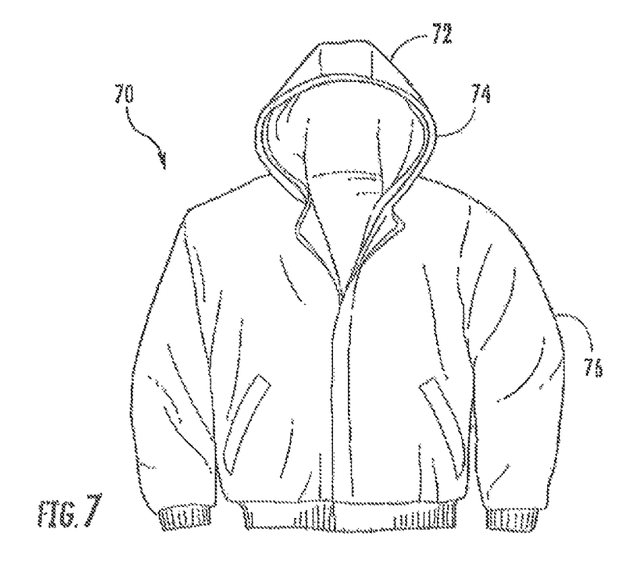
FIG. 7 is a perspective view of an embodiment of a garment made in accordance with the present disclosure.

For exemplary purposes only, various examples of apparel that may be made in accordance with the present disclosure are illustrated in FIGS. 6 and 7.

FIG. 6, for instance, illustrates a shirt 60 designed to wear next to a wearer's skin under body armor. As shown, shirt 60 includes sleeves 62 and 64 and a crew neck 66. In this embodiment, the shirt 60 is intended to be pulled over one's head and does not include any front zippers or buttons.

FIG. 7 shows another embodiment of a garment made in accordance with the present disclosure. In this embodiment, the garment comprises a jacket 70 including a front zipper and a hood 72. The jacket 70 comprises a multilayer construction including at least an outer shell material 76 and an inner lining material 74. If desired, a fill material may be positioned between the lining layer 74 and the outer shell layer 76. Fabrics made in accordance with the present disclosure can be used to construct the inner lining layer 74, the outer shell layer 76, or can be used to construct both layers.

Certain fabrics and garments made in accordance with the present disclosure have excellent flame resistant properties. For instance, fabrics made according to the present disclosure can pass the standard performance specification for labeling protective clothing as heat and flame resistant. This test is described by ASTM Test Method F2302-08. The above test provides specifications that provide minimum requirements for labeling protective clothing as heat and flame resistant for applications where the potential for flame contact or high heat exposure exist. For instance, such fabrics are needed for firefighting garments and for articles that may be exposed to high energy electrical arcs, and exposure to flash fires.

One test that is used to measure the fire resistant properties of a fabric is known as the vertical flame test. According to the vertical flame test, a fabric specimen is maintained in a static, draft-free, vertical position and exposed to an ignition source, namely an open flame. After exposure to a flame for a predetermined amount of time, measurement values are obtained for after flame time, after glow time, and char length. The vertical flame test corresponds to ASTM Test Method D6413-08.

In one embodiment, a fabric substrate made in accordance with the present disclosure may have char length of less than about 5 inches, less than about 4 inches, less than about 3 inches or even less than about 2 inches when tested according to ASTM Test Method D6413-08. The fabric substrate can have an afterglow of less than about 10 seconds, such as less than about five seconds, such as less than about two seconds, such as even less than about one second. The fabric substrate can also have an after flame of less than about 10 seconds, such as less than about five seconds, such as less than about two seconds, such as even less than about one second when tested according to ASTM Test Method D6413-08.

Fabrics and other apparel made in accordance with the present disclosure can also be configured to display great burn protective ability, especially when tested according to ASTM Test Method F1930, which is also referred to as the Thermal Mannequin Test. According to the Thermal Mannequin Test, a fully instrumented, life-sized mannequin is covered with an article of clothing and subjected to a simulated flash fire condition for 4 seconds. The mannequin can include over 100 individual heat sensors. The flash fire that is produced creates a large volume of fire which fully engulfs the mannequin.

The Thermal Mannequin Test determines the ability of the apparel to withstand the flash fire, without completely disintegrating. The heat sensors can also calculate the temperature of the mannequin below the garment in order to determine the extent of injury. For instance, the data can indicate whether a human would have suffered second degree burns or third degree burns.

Garments and apparel made in accordance with the present disclosure are capable of withstanding the Thermal Mannequin Test and protecting the mannequin from third degree burns, and even from second degree burns.

Fabric substrates and garments made according to the present disclosure also perform well under ASTM Test Method F2703, which is referred to as the Thermal Protective Performance Test. For instance, fabric substrates made according to the present disclosure when tested according to ASTM Test Method F2703 can have a rating of less than 50 cal/cm$^2$, such as less than about 40 cal/cm$^2$, such as less than about 30 cal/cm$^2$, such as even less than about 20 cal/cm$^2$. In one embodiment, for instance, the fabric substrates can have a rating of from about 5 cal/cm$^2$ to about 30 cal/cm$^2$.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A thermal protective garment comprising:
    a jacket or pants including an outer shell material shaped to cover a user's body, the outer shell material comprising a fabric laminate, the fabric laminate including a first outer layer, the first outer layer comprising non-inherently flame resistant synthetic fibers in an amount of at least about 70% by weight based on the weight of the first outer layer, the non-inherently flame resistant synthetic fibers comprising polyamide fibers, polyester fibers, polyolefin fibers, or mixtures thereof;
    a film layer positioned adjacent to the first outer layer, the film layer being comprised of a polyester, a polyurethane, or a polytetrafluoroethylene polymer;
    a second outer layer, the film layer being positioned inbetween the first outer layer and the second outer layer, the second outer layer comprising inherently flame resistant fibers;
    wherein at least the first outer layer contains a flame retardant composition, the flame retardant composition containing at least one flame retardant, the flame retardant comprising a halogen-containing compound or a compound containing phosphorus; and
    wherein the fabric laminate has an after flame of less than about 10 seconds when tested according to ASTM Test Method D6413-08.

2. A thermal protective garment as defined in claim 1, wherein the first outer layer forms an exterior surface of the jacket or pants and the second outer layer faces a wearer.

3. A thermal protective garment as defined in claim 1, wherein the fabric laminate only includes three layers.

4. A thermal protective garment as defined in claim 1, wherein the first outer layer contains non-inherently flame resistant synthetic fibers in an amount of at least about 80% by weight based upon the weight of the first outer layer.

5. A thermal protective garment as defined in claim 1, wherein the non-inherently flame resistant synthetic fibers contained in the first outer layer comprise polyamide fibers.

6. A thermal protective garment as defined in claim 1, wherein the film layer comprises an elastic film.

7. A thermal protective garment as defined in claim 1, wherein the first outer layer comprises a knitted fabric.

8. A thermal protective garment as defined in claim 1, wherein the first outer layer comprises a woven fabric.

9. A thermal protective garment as defined in claim 1, wherein the second outer layer contains meta-aramid fibers, para-aramid fibers or mixtures thereof.

10. A thermal protective garment as defined in claim 1, wherein the second outer layer contains a mixture of meta-aramid fibers and para-aramid fibers.

11. A thermal protective garment as defined in claim 1, wherein the film layer is attached to the first outer layer by a flame resistant adhesive and the film layer is attached to the second outer layer also by a flame resistant adhesive.

12. A thermal protective garment as defined in claim 1, wherein the fabric laminate has a basis weight of from about 3 osy to about 12 osy.

13. A thermal protective garment as defined in claim 1, wherein the flame retardant contained in the flame retardant composition comprises a compound containing phosphorus.

14. A thermal protective garment as defined in claim 1, wherein the first outer layer comprises polyester fibers or polyamide fibers blended with elastic fibers, the elastic fibers being present in the first outer layer in an amount up to about 15% by weight.

15. A thermal protective garment as defined in claim 1, wherein the outer shell material further comprises a durable water-resistant treatment.

16. A thermal protective garment as defined in claim 1, further comprising a printed color visible on an exterior surface of the outer shell material.

17. A thermal protective garment as defined in claim 16, wherein the printed color comprises a camouflage pattern.

18. A thermal protective garment as defined in claim 16, wherein the outer layer of the fabric laminate has been dyed prior to being printed.

19. A thermal protective garment as defined in claim 1, wherein the outer layer of the fabric laminate has been dyed.

20. A thermal protective garment comprising:
an outer shell material shaped to cover a user's body, the outer shell material comprising a fabric laminate, the fabric laminate including a first outer layer, the first outer layer comprising non-inherently flame resistant synthetic fibers in an amount of at least about 70% by weight based on the weight of the first outer layer, the non-inherently flame resistant synthetic fibers comprising polyamide fibers, polyester fibers, polyolefin fibers, or mixtures thereof;
a film layer positioned adjacent to the first outer layer, the film layer being comprised of a polyester, a polyurethane, or a polytetrafluoroethylene polymer;
a second outer layer, the film layer being positioned inbetween the first outer layer and the second outer layer, the second outer layer comprising inherently flame resistant fibers, the inherently flame resistant fibers comprising meta-aramid fibers, para-aramid fibers, or mixtures thereof; and
wherein at least the first outer layer contains a flame retardant composition, the flame retardant composition containing at least one flame retardant, the flame retardant comprising a halogen-containing compound or a compound containing phosphorus;
wherein the flame retardant composition is contained in at least the first outer layer in an amount of from about 0.5% to about 20% by weight of the fibers of at least the first outer layer; and
wherein the fabric laminate has an after flame of less than about 10 seconds when tested according to ASTM Test Method D6413-08.

21. A thermal protective garment as defined in claim 20, wherein the fabric laminate only includes three layers, the first outer layer containing polyamide fibers, the second outer layer containing meta-aramid fibers, the fabric laminate having a basis weight of from about 3 osy to about 12 osy.

* * * * *

UNITED STATES PATENT AND TRADEMARK OFFICE
CERTIFICATE OF CORRECTION

PATENT NO. : 10,183,465 B1
APPLICATION NO. : 15/000757
DATED : January 22, 2019
INVENTOR(S) : Jeffery B. Bowman, Wesley W. Burgess and Malcolm Hensley Page 1 of 1

It is certified that error appears in the above-identified patent and that said Letters Patent is hereby corrected as shown below:

On the Title Page

Item (63), "Continuation of application No. 13/302,462, filed on Nov. 22, 2011, now abandoned", should read -- "Continuation of application No. 13/302,460, filed on Nov. 22, 2011, now abandoned" --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*